United States Patent [19]

Tamai et al.

[11] Patent Number: 4,850,216
[45] Date of Patent: Jul. 25, 1989

[54] METHOD FOR ACCURATE SUCTION/REMOVAL DETECTION AND SUCTION/TRANSFER APPARATUS FOR PRACTICING THE SAME

[75] Inventors: Kouichi Tamai, Yokohama; Shigeyuki Motokawa, Tokyo; Noriyuki Hirata, Yokohama, all of Japan

[73] Assignee: Kabushiki Kaisha Toshiba, Kawasaki, Japan

[21] Appl. No.: 126,228

[22] Filed: Nov. 27, 1987

[30] Foreign Application Priority Data

Nov. 28, 1986 [JP] Japan ................... 61-283544

[51] Int. Cl.⁴ .............................. G01B 13/00
[52] U.S. Cl. ............................. 73/37.6
[58] Field of Search ..................... 73/37, 37.6

[56] References Cited

U.S. PATENT DOCUMENTS 3,674,140 7/1972 File ................... 73/37.6 X
4,510,683 4/1985 Fedde et al. ............ 29/701
4,683,654 8/1987 Scholten et al. ........ 73/37 X

FOREIGN PATENT DOCUMENTS 0045436 2/1982 European Pat. Off. .

Primary Examiner—Stewart J. Levy
Assistant Examiner—Joseph W. Roskos
Attorney, Agent, or Firm—Cushman, Darby & Cushman

[57] ABSTRACT

A suction detector which can accurately detect suction and removal of an object to be chucked, includes: a pressure sensor for detecting the pressure in a suction path for chucking the object and for generating pressure data corresponding to the detected pressure; a delaying circuit for delaying transmission of the pressure data from the pressure sensor and for generating delayed pressure data; and a suction/removal detecting unit for comparing first total data of the delayed pressure data from the delaying circuit and adjustably-set first level difference data with the pressure data from the pressure sensor, to detect suction of the object, and for comparing second total data of the pressure data from the pressure sensor and adjustably-set second level difference data with the delayed pressure data from the delaying circuit, to detect removal of the object. The delaying circuit comprises an integrating circuit which includes a resistor and a capacitor, and removes spike noise.

19 Claims, 7 Drawing Sheets

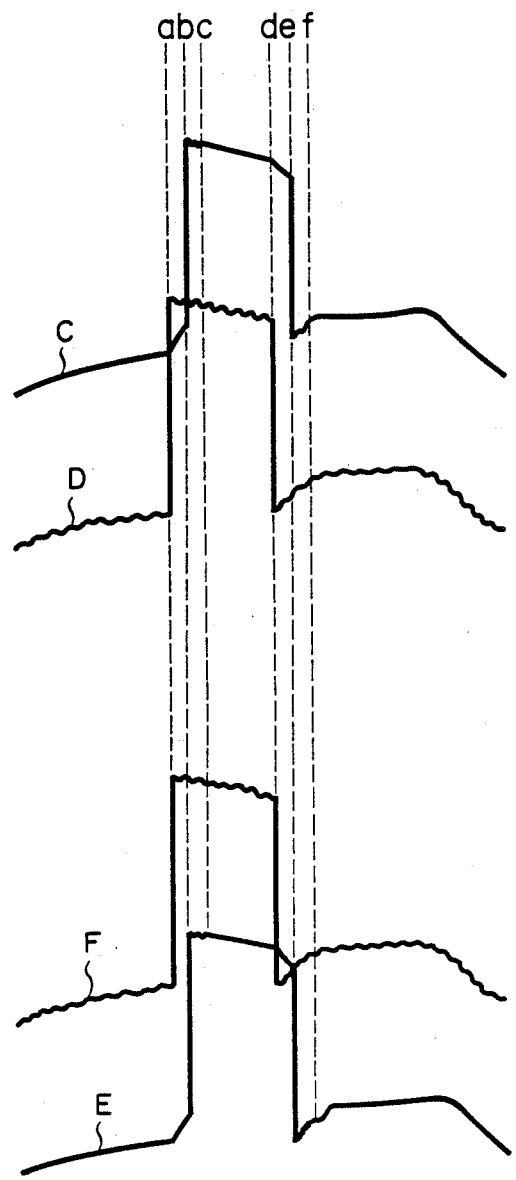
F I G. 6

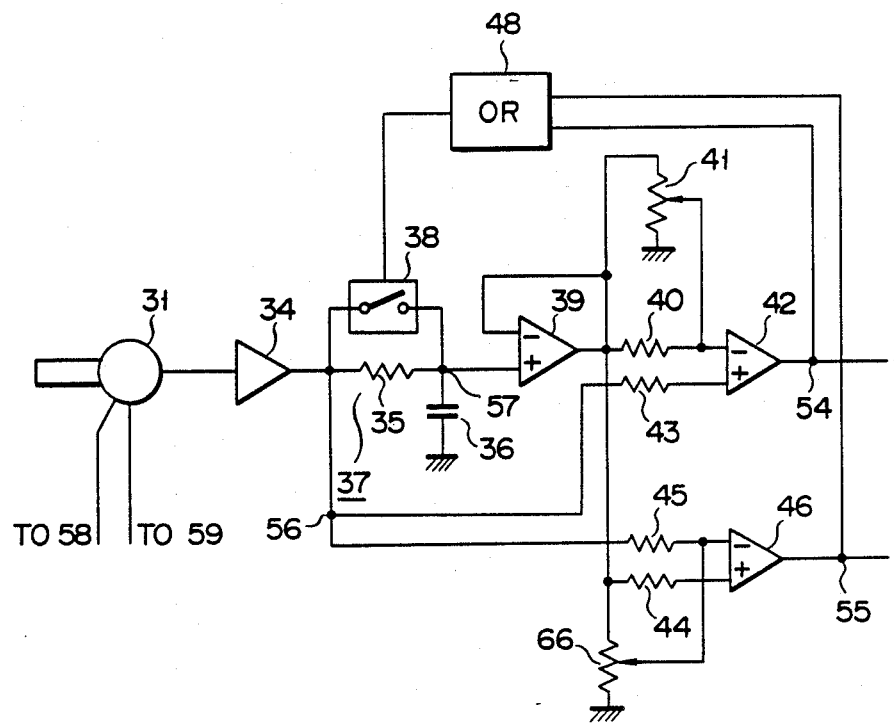
F I G. 8
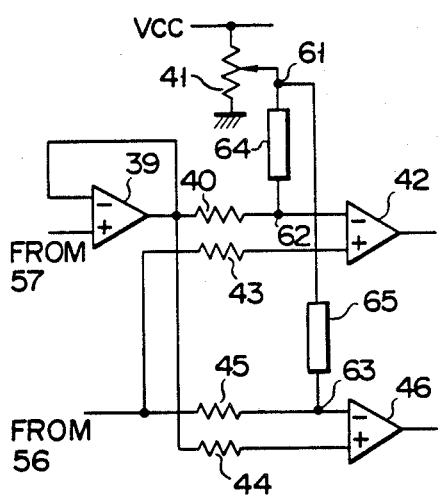
F I G. 9
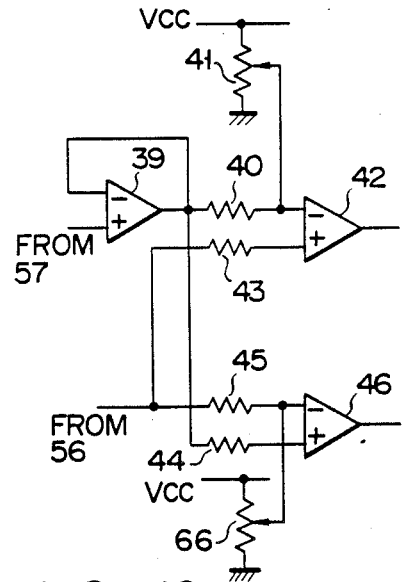
F I G. 10

METHOD FOR ACCURATE SUCTION/REMOVAL DETECTION AND SUCTION/TRANSFER APPARATUS FOR PRACTICING THE SAME

BACKGROUND OF THE INVENTION

The present invention relates to an improved suction detector which can accurately detect suction and removal of, for example, semiconductor parts or electronic parts, and a suction/transfer apparatus which incorporates the same.

Conventionally, a suction detector utilizes a pressure difference in a fluid and detects suction/removal of, for example, semiconductor parts or electronic parts during conveyance of the parts. A suction/transfer apparatus incorporating such a detector includes a suction nozzle, with the suction detector itself being located between the suction nozzle and a vacuum device. When an object is chucked by a reduced pressure, the suction detector detects a reduction in the pressure and hence suction of the object. When the object is removed by increasing the pressure, the suction detector detects an increase in the pressure and hence removal of the object. Examples of a pressure sensor used in the above suction/transfer apparatus are a mechanical type which varies a contact position in accordance with a change in pressure, and an electric type which uses a semiconductor transducer. FIG. 1 shows an arrangement of a conventional suction detector which uses a semiconductor transducer.

Referring to FIG. 1, semiconductor transducer 111 for converting a pressure value of a fluid into a resistance is connected between terminals 112 and 113 through diode 114 and converter 115 for converting a constant voltage into a constant current. An output terminal of transducer 111 is connected to the inverting input terminal of operational amplifier 117 as a comparator through operational amplifier 116 as an amplifier. The non-inverting input terminal of amplifier 117 is connected to a variable terminal of variable resistor 118 provided between converter 115 and terminal 113. The output terminal of amplifier 117 is connected to the base of transistor 119, the emitter of transistor 119 is connected to terminal 113, and its collector is connected to terminal 120. Diode 121 is connected between the emitter and the collector of transistor 119 so that an anode of diode 121 is connected to the emitter of transistor 119. Light-emitting diode 122 for display is connected between the base of transistor 119 and terminal 113.

An operation of the circuit shown in FIG. 1 will be described below, with reference to FIG. 2.

First, by adjusting resistor 118, level A is set at a constant value not crossing a drift value of a pressure. However, a resistance of transducer 111 varies in accordance with the pressure. Therefore, level B of the inverting input terminal of amplifier 117 varies in accordance with a pressure value of a fluid. Since the pressure of the fluid is high when an object is not chucked to the nozzle, an output voltage is low and level B of the inverting input terminal of operational amplifier 117 becomes lower than level A. However, since the fluid pressure is low when an object is chucked by a suction nozzle, an output voltage of transducer 111 is high, and hence level B of the inverting input terminal of the amplifier 117 becomes higher than level A. Therefore, when the object is not chucked, an output from the amplifier 117 becomes negative, and no current is supplied to the base of transistor 119. However, when the object is chucked, an output from amplifier 117 becomes positive, and a current is supplied to the base of transistor 119. Therefore, transistor 119 is turned on, and diode 122 emits light to indicate that the object is chucked. Thus, suction is repeatedly detected in accordance with a suction operation of the object.

However, in the above circuit, pressure level B is varied due to the presence of a vacuum device while level A is fixed as shown in FIG. 2. Therefore, when level B is at P2 or P4, suction can be detected, but when level B is at P1, P3, or P5, suction cannot be detected because level A is higher than level B. As a result, although an object is chucked, no suction is detected and hence the object cannot be transferred.

In addition, if an orifice of the suction nozzle is narrow, a pressure difference in suction becomes small. Therefore, since level A become higher than level B, suction cannot be detected. Moreover, since a size of the orifice is varied by dirt of the suction nozzle and the like during an operation, detection accuracy is degraded or suction cannot be detected.

Since level A is fixed, detection time varies upon pressure change in pipe 4, and in a high-speed machine in particular, the detection timing error may occur.

SUMMARY OF THE INVENTION

The present invention has been made in consideration of the above situation, and has as its object to provide a suction/transfer apparatus which can reliably transfer an object to be chucked when a pressure varies, when a pressure difference between suction and nonsuction is small because a suction nozzle is narrow, or when a size of an orifice varies due to dirt of the suction nozzle.

A suction detector of the suction/transfer apparatus includes:

a pressure sensor for detecting a pressure in a suction path for chucking the object to be chucked and generating pressure data corresponding to a detected pressure. Delaying section delays transmission of the pressure data from the pressure sensor and generates delayed pressure data. Suction/removal detecting section compares first total data of the delayed pressure data from the delaying section and adjustably-set first level difference data with the pressure data from the pressure sensor to detect suction of the object to be chucked, and compares second total data of the pressure data from the pressure sensor and adjustably-set second level difference data with the delayed pressure data from the delaying section to detect removal of the object to be chucked.

According to the suction detector of the present invention, an integrator and a level setter are provided. That is, in accordance with a pressure signal from a pressure sensor, an integrated pressure signal obtained by integrating the pressure signal by the integrator, and a level difference signal set by the level setter, a suction comparator detects suction of the object, and a removal comparator detects removal thereof. Since the level difference signal can be set by the level setter, suction and removal can be accurately detected even if the pressure difference between suction and nonsuction modes of the object is relatively small. In this case, the level difference signal varies together with a pressure variation. Therefore, erroneous detection caused by the pressure variation can be prevented, and detection accuracy is not degraded by a change in an orifice diameter caused by dirt of the suction nozzle. In addition, since the level difference signal varies in accordance with the pressure variation, a detection timing error does not occur. Therefore, the suction detector according to the present invention is always stable and hence can be applied for detection in a high-speed machine.

BRIEF DESCRIPTION OF THE DRAWINGS

FIG. 6 and FIGS. 7A and 7B are graphs for explaining an operation of the first embodiment of the suction detector shown FIG. 3; and FIGS. 8, 9, and 10 are block diagrams of arrangements of other embodiments of the suction detector according to the present invention, respectively, and showing parts different from those of the first embodiment.

DETAILED DESCRIPTION OF THE PREFERRED EMBODIMENTS

A suction/transfer apparatus and an improved suction detector according to the present invention will be described below with reference to the accompanying drawings.

Figure 1:
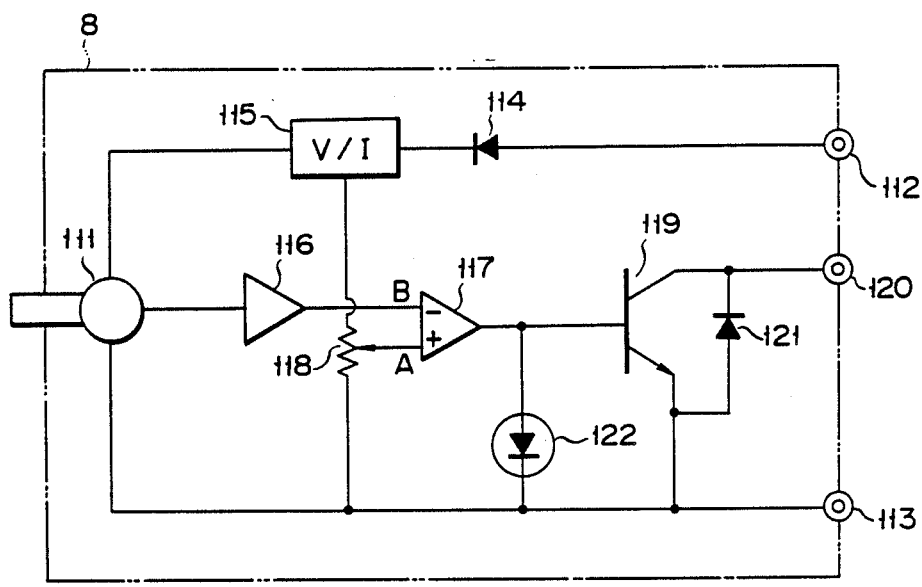
FIG. 1 is a block diagram of an arrangement of a conventional suction detector.
Figure 2:
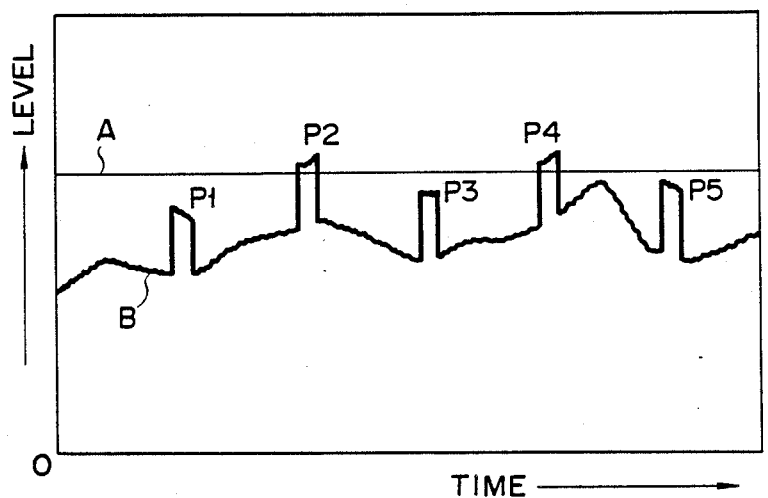
FIG. 2 is a graph for explaining an operation of the conventional suction detector.
Figure 3:
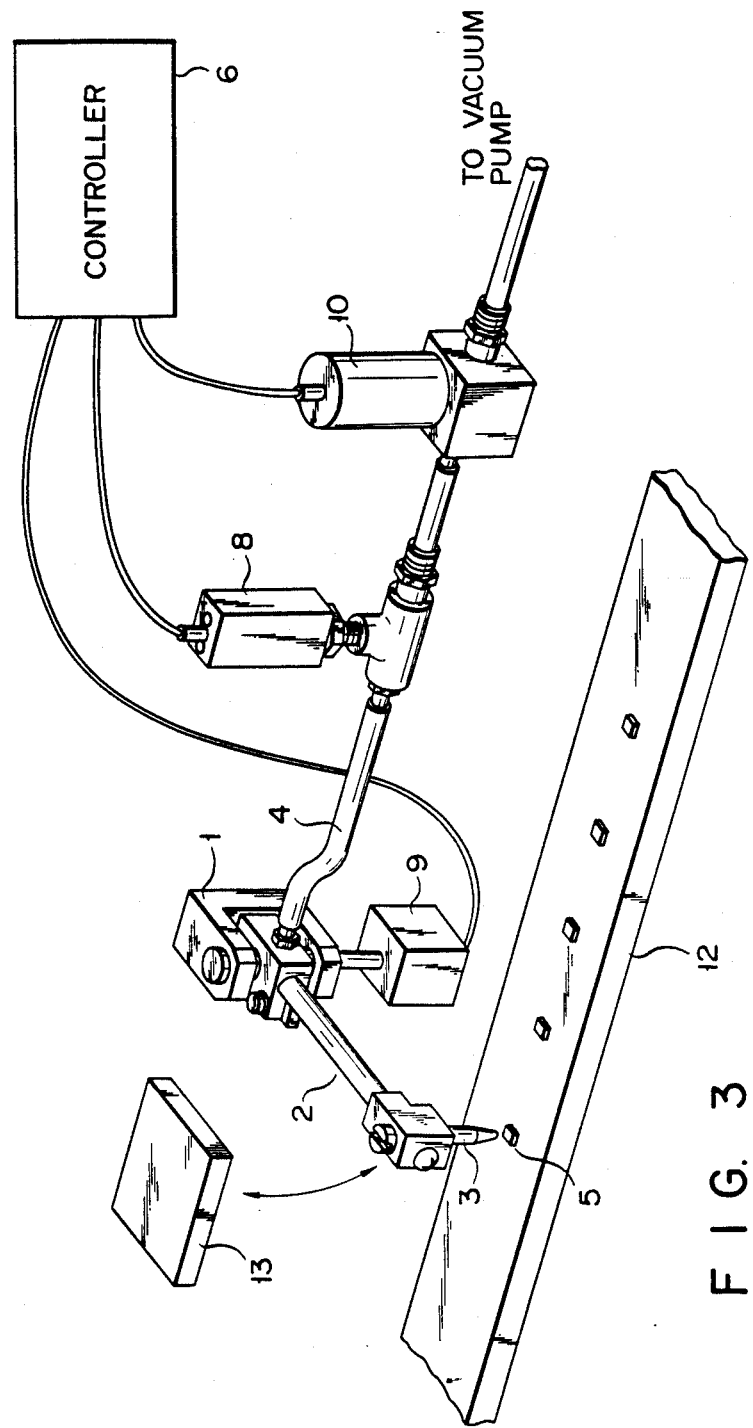
FIG. 3 is a perspective view of an arrangement of a suction/transfer apparatus according to the present invention.

FIG. 3 shows a suction/transfer apparatus according to the present invention which utilizes a pressure difference in a fluid. In FIG. 3, pivotal arm portion 2 having suction nozzle 3 at its distal end is provided to support portion 1. An arm consists of a pipe. Arm portion 2 is connected to a decompression device (vacuum pump) through hose 4, solenoid valve 10, and suction detector 8. That is, the pipe of arm portion 2 and hose 4 form a fluid path between the decompression device and suction nozzle 3. Detector 8 (to be described later in detail) branched from the path detects suction and removal of object to be chucked 5 in accordance with a change in pressure of the path and sends a detection result to controller 6. Valve 10 connects the path from nozzle 3 to the atmosphere or the decompression device in accordance with a control signal from controller 6.

The rotating shaft of arm portion 2 provided to support portion 1 is rotated by drive portion 9 in accordance with the control signal from controller 6. Therefore, object 5 on conveyor 12, which is chucked by nozzle 3, is transferred to table 13. Conveyor 12 is controlled by controller 6.

An operation of the suction/transfer apparatus according to the present invention will be described below with reference to FIGS. 4A to 4D.

Figure 4:
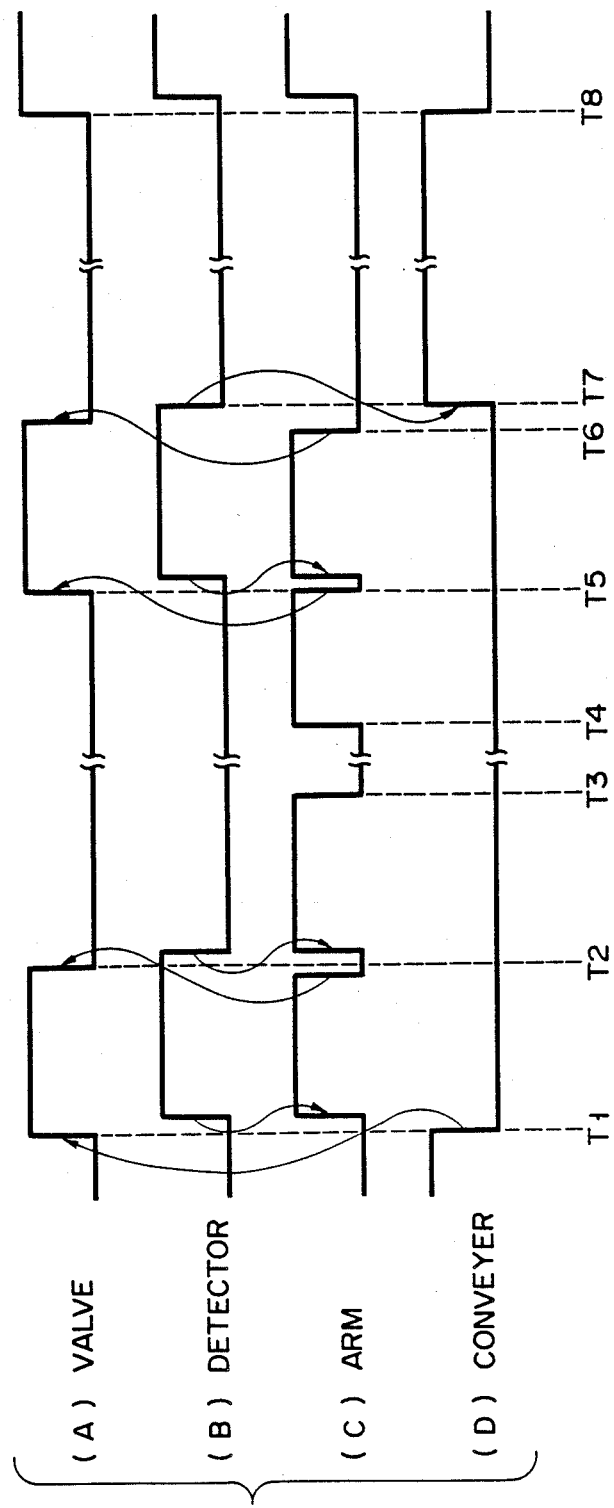
FIG. 4A to 4D are timing charts for explaining an operation of the suction/transfer apparatus shown in FIG. 3.

As shown in FIG. 4D, conveyor 12 moves and conveys object 5 below nozzle 3 at timing T1. When controller 6 detects this, valve 10 is opened in accordance with a suction control signal from controller 6 as shown in FIG. 4A, and the path of pipe 4 is connected to the decompression device. Before the suction control signal is input, the path is connected to the atmosphere by valve 10. When the path is connected to the decompression device, a pressure in pipe 4 is reduced, and object 5 is chucked to nozzle 3.

When detector 8 detects suction of object 5 as shown in FIG. 4B, controller 6 outputs a rotation control signal to drive portion 9. As shown in FIG. 4C, in accordance with the rotation control signal, arm portion 2 is rotated toward table 13 while object 5 is chucked by nozzle 3. When it is detected that nozzle 3 reaches a predetermined position on table 13, controller 6 outputs a removal control signal to valve 10. Therefore, as shown in FIG. 4A, valve 10 connects the path to an opening portion in accordance with the removal control signal at timing T2. Therefore, when the pressure in pipe 4 is increased to reach the atmospheric pressure, object 5 is removed from nozzle 3 and placed on table 13.

When detector 8 detects removal of object 5 as shown in FIG. 4B, controller 6 outputs a reverse rotation control signal to drive portion 9. As shown in FIG. 4C, drive portion 9 returns arm portion 2 to its original position in accordance with the reverse rotation control signal. When it is detected that arm portion 2 is returned to the original position at timing T3, controller 6 outputs a processing start signal. Therefore, object 5 is processed on table 13 in accordance with the start signal.

After the processing is ended and a processing end signal is input, controller 6 outputs the rotation control signal to drive portion 9 as described above at timing T4. Therefore, arm portion 2 is rotated. When arm portion 2 reaches table 13 at timing T5, controller 6 outputs the suction control signal to valve 10. Therefore, object 5 on table 13 is chucked by nozzle 3 as described above.

When detector 8 detects suction of object 5 as shown in FIG. 4B, controller 6 outputs the reverse rotation control signal to drive portion 9. Therefore, arm portion 2 returns to the original position while object 5 is chucked by nozzle 3.

When it is detected that arm portion 2 returns to the original position at timing T6, controller 6 outputs the removal control signal to valve 10. Therefore, object 5 is placed on conveyor 12. When detector 8 detects removal of object 5 as shown in FIG. 4B, conveyor 12 is driven by controller 6 at timing T7 as shown in FIG. 4D. Conveyor 12 conveys next object 5 to the predetermined position below nozzle 3. Thereafter, the above operation is repeated.

In this embodiment, an object to be chucked is transferred onto a table, processed thereon, and then returned to a conveyor. However, if the object is to be transferred to another conveyor or the like after processing, it is obvious for a person skilled in the art that timings are difference from those shown in FIGS. 4A to 4D.

Figure 5:
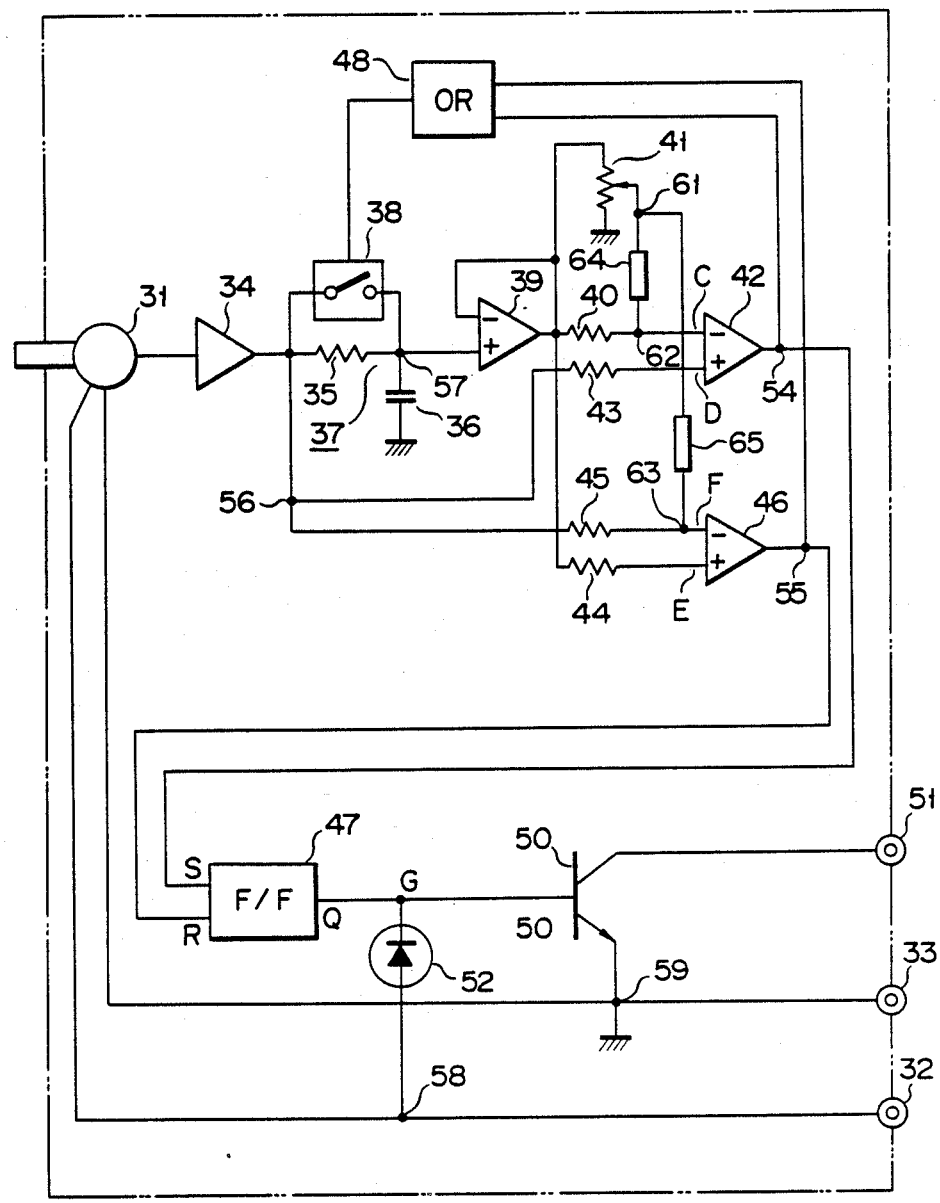
FIG. 5 is a block diagram of an arrangement of a first embodiment of a suction detector according to the present invention and incorporated in the suction/transfer apparatus shown in FIG. 3.

Suction detector 8 shown in FIG. 3 will be described in detail with reference to FIG. 5.

First, referring to FIG. 5, an arrangement of a first embodiment of detector 8 according to the present invention will be described. As a pressure sensor, a mechanical type which varies a contact position in accordance with a pressure change may be used. However, in detector 8 of the present invention shown in FIG. 5, a semiconductor transducer is used as pressure sensor 31 for detecting a pressure of a fluid. A semiconductor transducer detects a pressure change by converting it into a change in a resistance. In the transducer, a silicon crystal is used as, e.g., a pressure-sensitive element of a diaphragm structure. A strain resistor is patterned on the surface of the pressure-sensitive element by thermal diffusion. The diaphragm deforms by a pressure of the fluid, and the resistance is changed utilizing a piezo resistance effect.

The input terminals of transducer 31 are connected to terminals 32 and 33 respectively through nodes 58 and 59. Constant currents are supplied to transducer 31 through terminals 32 and 33. The output terminal of transducer 31 is connected to operational amplifier 34. The output terminal of amplifier 34 is connected to integrator 37 including resistor 35 and capacitor 36 and to node 56. Integrator 37 removes spike noise and the like and integrates an output from amplifier 34. Switching circuit 38 is provided in parallel with resistor 35 and incorporates a timer. Circuit 38 is turned on at a timing controlled by OR gate 48 and turned off after a time predetermined by the timer has passed.

Midpoint node 57 between resistor 35 and capacitor 36 of integrator 37 is connected to the non-inverting input terminal of operational amplifier 39. An output from amplifier 39 is fed back to the inverting input terminal thereof so as to constitute a voltage follower circuit. The output terminal of amplifier 39 is connected to the inverting input terminal of suction comparator 42 through resistor 40 and node 62 and to the non-inverting input terminal of removal comparator 46 through resistor 44. The output terminal of amplifier 39 is also connected to one end of variable resistor 41 as level setter 41. The other end of resistor 41 is grounded.

Resistor 43 is connected to node 56 at its one end and is connected to the non-inverting input terminal of comparator 42 at its other end. Resistor 45 is connected to node 56 at its one end and is connected to the inverting input terminal of comparator 46 through node 63 at its other end. Element 64 is connected between node 62 and a variable terminal of resistor 41 and element 65 is connected between node 63 and the variable terminal of resistor 41. Since one end of resistor 41 is connected to the output terminal of amplifier 39, not only a difference is provided between input signals to comparators 42 and 46, but also a pulse height during suction is enhanced.

For example, resistors 40, 43, 44, and 45 have the same resistance. If elements 64 and 65 are resistors, their resistances are sufficiently larger than those of resistors 40, 43, 44, and 45. If elements 64 and 65 are diodes, they are connected such that their anodes face node 61 and their cathode face nodes 62 and 63, respectively. Therefore, a current flowing into node 62 from node 56 through resistor 45 and elements 65 and 64 can be almost prevented. In addition, a current flowing into node 62 from the output terminal of amplifier 39 through resistor 45 and elements 65 and 64 can be almost prevented. The output terminals of comparators 42 and 46 are connected to nodes 54 and 55, respectively.

Node 54 is connected to set terminal S of flip-flop (F/F) 47, and node 55 is connected to reset terminal R of F/F 47. The input terminals of two-input OR gate 48 are connected to nodes 54 and 55. Output terminal Q of F/F 47 is connected to the base of transistor 50 as an output circuit. The collector of transistor 50 is connected to terminal 51, and its emitter is connected to terminal 33 and is grounded through node 59. Light-emitting diode 52 for display is connected between terminal Q and node 58 connected to terminal 32.

An operation of the first embodiment will be described below with reference to FIG. 6 and FIGS. 7A and 7B.

First, resistor 41 as a level setter is adjusted in accordance with an actual pressure difference between suction and nonsuction modes of object 5 such as semiconductor parts or electronic parts. A resistance of transducer 31 changes in accordance with a change in pressure of the fluid. A constant current is supplied to transducer 31, and a pressure signal corresponding to the pressure change of the fluid is output to amplifier 34. Amplifier 34 amplifies the pressure signal. Then, in order to delay the amplified pressure signal and to removes spike noise and the like, amplifier 34 outputs the amplified pressure signal to integrator 37.

In order to detect suction of object 5, comparator 42 compares total signal C of the delayed pressure signal from integrator 37 through voltage follower 39 and resistor 40 and the level difference signal from resistor 41 with amplified pressure signal D from amplifier 34. When object 5 is chucked, the pressure of the fluid reduces, and a voltage from transducer 31 abruptly increases. For this reason, at timing a, signal D becomes larger than signal C which is integrated and hence does not abruptly increase. At this time, an output from comparator 42 becomes positive, and F/F 47 is set. Therefore, transistor 50 is turned on, and diode 52 is turned on to indicate detection of suction.

Since a response speed of integrator 37 is low, OR gate 48 drives circuit 38 when the output from comparator 42 is positive. As shown by timing b in FIG. 6, when circuit 38 is driven, it is turned on to bypass resistor 35. As a result, the delayed pressure signal abruptly rises. Thereafter, circuit 38 is turned off by the built-in timer at timing c. Therefore, the amplified pressure signal is integrated by integrator 37.

In order to detect removal of object 5, comparator 46 compares total signal F of the amplified pressure signal from amplifier 34 and the level difference signal from resistor 41 with delayed pressure signal E from integrator 37 through voltage follower 39 and resistor 44. When object 5 is removed, the pressure of the fluid increases, and the voltage from transducer 31 abruptly reduces. For this reason, at timing d, signal F becomes lower than signal E which is integrated and hence does not abruptly reduce. At this time, an output from comparator 46 becomes positive, and F/F 47 is reset. Therefore, transistor 50 is turned off, and diode 52 for indicating detection of suction is turned off.

Since the response speed of integrator 37 is low, OR gate 48 drives circuit 38 when the output from comparator 46 is positive. As shown by timing e in FIG. 6, when circuit 38 is driven, it is turned on to bypass resistor 35. As a result, the delayed pressure signal abruptly falls. Thereafter, circuit 38 is turned off by the built-in timer at timing f. Therefore, the amplified pressure signal is integrated by integrator 37.

At this time, one end of resistor 41 is connected to the output terminal of amplifier 39. Therefore, the larger the pressure difference is, the larger the pulse heights of signals C and E become.

Figures 7A, 7B:
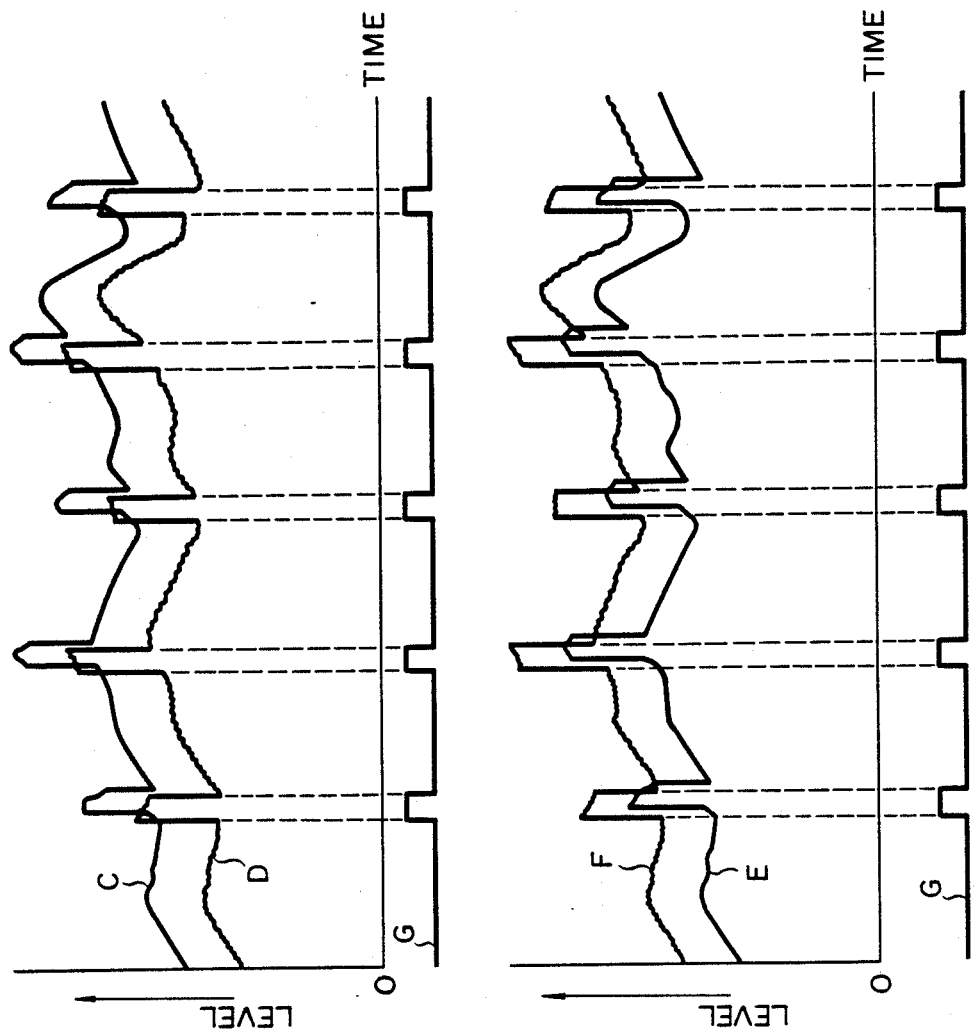

Not that pulsed graph G in FIGS. 7A and 7B represents a suction/removal state of object 5. When an operation is performed as shown in FIGS. 7A and 7B, spike noise can be removed by the integrator even if the noise is generated. Therefore, if the level setter provides a proper level difference signal, the suction detector can accurately detect suction and removal. In addition, according to the above embodiment, switching circuit 38 is provided in parallel with integrator 37 and is closed in accordance with the output from comparator 42 or 46, thereby forming a bypass circuit. Therefore, since an output value is not integrated for a predetermined time interval after suction or removal of object 5, a response time is shortened. Moreover, since a display element such as light-emitting diode 52 or the like is provided, suction/removal of object 5 can be easily confirmed.

According to experiments, results shown in the following Table are obtained with respect to a conventional suction detector.

|  | Conventional Detector | Above Embodiment |
| --- | --- | --- |
| Degree of Freedom with Respect to Pressure Variation [mmHg] | 60 | 480 |
| Degree of Freedom of Suction Detection Accuracy [mmHg] | 20 | 5 |

As is apparent from the above Table, according to the first embodiment, the degree of freedom with respect to a pressure variation is improved from 60 [mmHg] to 480 [mmHg], i.e., 8 times that of the conventional detector, and the suction detection accuracy is improved from 20 [mmHg] to 5 [mmHg], i.e., 4 times that of the conventional detector.

FIG. 8 shows a second embodiment of suction detector 8 of the present invention. The second embodiment is substantially the same as the first embodiment. The second embodiment differs from the first embodiment that level setter (variable resistor) 66 is provided in addition to level setter 41. One end of resistor 66 is connected to the output terminal of operational amplifier 39, and its other end is grounded. A variable terminal of resistor 66 is connected to the inverting input terminal of removal comparator 46. Therefore, setter 41 supplies a level difference signal to only the inverting input terminal of suction comparator 42, and setter 66 supplies the level difference signal to only the inverting input terminal of comparator 46. An operation of the second embodiment is the same as that of the first embodiment.

FIG. 9 shows a third embodiment of suction detector 8 of the present invention. The third embodiment is substantially the same as the first embodiment. The third embodiment differs from the first embodiment that one end of level setter 41 is connected not to the output terminal of operational amplifier 39 but to a power source region. Therefore, a difference between signals C and D and that between signals E and F shown in FIG. 6 are always maintained constant. In addition, peak heights of signals C, D, E and F become substantially the same. An operation of the third embodiment is the same as that of the first embodiment.

FIG. 10 shows a fourth embodiment of suction detector 8 of the present invention. The fourth embodiment is substantially the same as the first embodiment. The fourth embodiment differs from the second embodiment that one end of each of setters 41 and 61 is connected to a power source voltage. Therefore, a difference between signals C and D and that between signals E and F shown in FIG. 6 are always maintained constant. In addition, peak heights of signals C, D, E, and F become substantially the same. An operation of the fourth embodiment is the same as that of the first embodiment.

What is claimed is:

1. A suction detector which can accurately detect suction and removal of an object to be chucked by suction through a suction path comprising:

pressure detecting means for detecting a pressure in the suction path for chucking the object, and for generating pressure data corresponding to a detected pressure;

delaying means for delaying the pressure data from said pressure sensor to generate delayed pressure data; and suction/removal detecting means for adjustably generating first and second level difference data and for comparing a first sum data representing a sum of the delayed pressure data from said delaying means and the first level difference data, with the pressure data from said pressure detecting means, to detect suction of the object, and for comparing a second sum data representing a sum of the pressure data from said pressure detecting means and the second level difference data, with the delayed pressure data from said delaying means, to detect removal of the object.

2. The detector according to claim 1, wherein said delaying means comprises integrating means including a resistor and a capacitor connected in series with each other.

3. The detector according to claim 2, further comprising:

switching means, provided in parallel with said resistor of said integrating means, for short-circuiting said resistor for a predetermined period of time when suction of the object is detected and when removal of the object is detected.

4. The detector according to claim 1, wherein said suction/removal detecting means further includes:

outputting means for generating a suction signal which becomes active when suction of the object is detected and becomes inactive when removal of the object is detected.

5. The detector according to claim 1, wherein said suction/removal detecting means includes:

first level-setting means for generating the first level difference data which is adjustably set and substantially proportional to the delayed pressure data;

second level-setting means for generating the second level difference data which is adjustably set and substantially proportional to the delayed pressure data;

suction comparing means for comparing the first sum data of the delayed pressure data from said delaying means and the first level difference data from said first level setting means, with the pressure data from said pressure detecting means to detect suction of the object; and removal comparing means for comparing the second sum data of the pressure data from said pressure detecting means and the second level difference data from said second level setting means, with the delayed pressure data from said delaying means, to detect removal of the object.

6. The detector according to claim 1, wherein
said suction/removal detecting means includes:

first level-setting means for generating the first level difference data which is adjustably set and substantially constant;

second level-setting means for generating second level difference data which is adjustably set and substantially constant;

suction comparing means for comparing the first sum data of the delayed pressure data from said delaying means and the first level difference data from said first level setting means with the pressure data from said pressure detecting means; and removal comparing means for comparing the second sum data of the pressure data from said pressure detecting means and the second level difference data from said second level setting means with the delayed pressure data from said delaying means.

7. The detector according to claim 1, wherein said suction/removal detecting means includes:

suction comparing means for comparing the first sum data of the displayed pressure data from said delaying means and the first level difference data, with the pressure data from said pressure detecting means, to detect suction of the object;

removal comparing means for comparing the second sum data of the pressure data from said pressure detecting means and the second level difference data, with the delayed pressure data from said delaying means, to detect removal of the object; and level setting means for generating level difference data which is adjustably set and substantially proportional to the delayed pressure data, for outputting the level difference data as the first level difference data to said suction comparing means, via a first element, and for outputting the level difference data as the second level difference data to said removal comparing means, via a second element.

8. The detector according to claim 1, wherein said suction/removal detecting means includes:

suction comparing means for comparing the first sum data of the delayed pressure data from said delaying means and the first level difference data, with the pressure data from said pressure detecting means, to detect suction of the object;

removal comparing means for comparing the second sum data of the pressure data from said pressure detecting means and the second level difference data, with the delayed pressure data from said delaying means, to detect removal of the object; and level-setting means for generating level difference data which is adjustably set and substantially constant, for outputting the level difference data as the first level difference data to said suction comparing means, via a first element, and for outputting the level difference data as the second level difference data to said removal comparing means, via a second element.

9. A suction/transfer apparatus which can accurately detect suction and removal of an object to be chucked and can reliably transfer the object, comprising:

transferring means having suction means at a distal end thereof for chucking/removing the object, and for transferring the object in accordance with an input suction signal;

pressure detecting means, connected to said suction means, for detecting a pressure in a suction path to said suction means for chucking the object, and generating pressure data corresponding to a detected pressure;

delaying means for delaying the pressure data from said pressure detecting means to generate delayed pressure data; and suction/removal detecting means for adjustably generating first and second level difference data for comparing a first sum data representing a sum of the delayed pressure data from said delaying means and the first level difference data, with the pressure data from said pressure detecting means, to detect suction of the object, and for comparing second sum data representing a sum of the pressure data from said pressure detecting means and the second level difference data, with the delayed pressure data from said delaying means to detect removal of the object, and for generating and outputting to said transferring means the suction signal representing that the object has been chucked.

10. The apparatus according to claim 9, wherein said delaying means comprises integrating means having a resistor and a capacitor connected in series with each other.

11. The apparatus according to claim 10, further comprising:

switching means, provided in parallel with said resistor of said integrating means, for short-circuiting said resistor for a predetermined period of time when suction of the object is detected and when removal of the object is detected.

12. The apparatus according to claim 9, wherein said suction/removal detecting means includes:

first level-setting means for generating first level difference data which is adjustably set and substantially proportional to the delayed pressure data;

second level-setting means for generating second level difference data which is adjustably set and substantially proportional to the delayed pressure data;

suction comparing means for comparing the first sum data of the delayed pressure data from said delayed means and the first level difference data from said first level setting means, with pressure data from said pressure detecting means, to detect suction of the object;

removal comparing means for comparing the second sum data of the pressure data from said pressure detecting means and the second level difference data from said second level setting means with the delayed pressure data from said delaying means, to detect removal of the object; and outputting means for generating and outputting to said transferring means the suction signal which becomes active when suction of the object is detected by said suction comparing means, and becomes inactive when removal of the object is detected by said removal comparing means.

13. The apparatus according to claim 9, wherein said suction/removal detecting means includes:

first level-setting means for generating first level difference data which is adjustably set and substantially constant;

second level-setting means for generating second level difference data which is adjustably set and substantially constant;

suction comparing means for comparing the first sum data of the delayed pressure data from said delaying means and the first level difference data from said first level setting means, with the pressure data from said pressure detecting means, to detect suction of the object;

removal comparing means for comparing the second sum data of the pressure data from said pressure detecting means and the second level difference data from said second level setting means, with the delayed pressure data from said delaying means, to detect removal of the object; and outputting means for generating and outputting to said transferring means the suction signal which becomes active when suction of the object is detected by said suction comparing means, and becomes inactive when removal of the object is detected by said removal comparing means.

14. The apparatus according to claim 2, wherein said suction/removal detecting means includes:

suction comparing means for comparing the first sum data of the delayed pressure data from said delaying means and the first level difference data, with the pressure data from said pressure detecting means, to detect suction of the object;

removal comparing means for comparing the second sum data of the pressure data from said pressure detecting means and the second level difference data, with the delayed pressure data from said delayed means, to detect removal of the object;

level-setting means for generating level difference data which is adjustably set and substantially proportional to the delayed pressure data, for outputting the level difference data as the first level difference data to said suction comparing means, via a first element, and for outputting the level difference data as the second level difference data to said removal comparing means, via a second element; and outputting means for generating and outputting to said transferring means the suction signal which becomes active when suction of the object is detected by said suction comparing means, and becomes inactive when removal of the object is detected by said removal comparing means.

15. The apparatus according to claim 9, wherein said suction/removal detecting means includes:

suction comparing means for comparing the first sum data of the delayed pressure data from said delaying means and the first level difference data, with the pressure data from said pressure detecting means, to detect suction of the object;

removal comparing means for comparing the second total data of the pressure data from said pressure detecting means and the second level difference data, with the delayed pressure data from said delaying means, to detect removal of the object;

level-setting means for generating level difference data which is adjustably set and substantially constant, for outputting the level difference data as the first level difference data to said suction comparing means, via a first element, and for outputting the level difference data as the second level difference data to said removal comparing means, via a second element; and outputting means for generating and outputting to said transferring means the suction signal which becomes active when suction of the object is detected by said suction comparing means, and becomes inactive when removal of the object is detected by said removal comparing means.

16. A method of accurately detecting suction and removal of an object to be chucked, comprising:

detecting a pressure in a suction path for chucking the object by a pressure sensor, to obtain pressure data corresponding to the detected pressure;

delaying the pressure data from said pressure sensor, to obtain delayed pressure data;

comparing first sum data representing a delayed pressure data and an adjustably-set first level difference data, with the pressure data, to detect suction of the object; and comparing second sum data of the pressure data and adjustably-set second level difference data, with the delayed pressure data, to detect removal of the object.

17. The method according to claim 16, further comprising a step of:

adjusting the first and second level difference data.

18. The method according to claim 16, wherein suction is detected when the pressure data becomes larger than the first sum data and thereafter when the first sum data again becomes larger than the pressure data.

19. The method according to claim 16, wherein removal of said object is detected when the second sum data becomes smaller than the delayed pressure data and thereafter when the second sum data again becomes larger than the delayed pressure data.

* * * * *